(12) United States Patent  
Gross et al.

(10) Patent No.: US 8,706,949 B2  
(45) Date of Patent: *Apr. 22, 2014

(54) MONOLITHIC READ-WHILE-WRITE FLASH MEMORY DEVICE

(75) Inventors: Dana Gross, Ramat Hasharon (IL); Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 1224 days.

This patent is subject to a terminal disclaimer.

(21) Appl. No.: 11/923,678

(22) Filed: Oct. 25, 2007

(65) Prior Publication Data

US 2008/0046636 A1    Feb. 21, 2008

Related U.S. Application Data

(63) Continuation-in-part of application No. 10/445,358, filed on May 27, 2003.

(60) Provisional application No. 60/463,556, filed on Apr. 16, 2003.

(51) Int. Cl.
*G06F 12/00* (2006.01)
*G06F 13/00* (2006.01)

(52) U.S. Cl.
USPC ............................ 711/103; 711/100; 711/154

(58) Field of Classification Search
USPC ................................. 711/100, 103, 154, 170
See application file for complete search history.

(56) References Cited

U.S. PATENT DOCUMENTS

| | | | |
|---|---|---|---|
| 5,043,940 A | 8/1991 | Harari | |
| 5,522,076 A * | 5/1996 | Dewa et al. | 713/2 |
| 5,596,526 A | 1/1997 | Assar et al. | |
| 5,732,017 A | 3/1998 | Schumann et al. | |
| 5,818,083 A | 10/1998 | Ito | |
| 5,821,143 A | 10/1998 | Kim et al. | |
| 5,982,671 A * | 11/1999 | Kang et al. | 365/185.33 |
| 6,240,001 B1 * | 5/2001 | Ross | 365/49.1 |
| 6,260,040 B1 | 7/2001 | Kauffman et al. | |
| 6,260,103 B1 | 7/2001 | Alexis et al. | |
| 6,279,068 B2 | 8/2001 | Brigati et al. | |
| 6,360,244 B1 * | 3/2002 | Bharadhwaj | 718/108 |
| 6,363,014 B1 | 3/2002 | Fastow | |
| 6,429,479 B1 | 8/2002 | Han et al. | |
| 6,591,327 B1 | 7/2003 | Briner et al. | |
| 6,614,685 B2 | 9/2003 | Wong | |
| 6,671,203 B2 | 12/2003 | Tanzawa et al. | |
| 6,781,879 B2 | 8/2004 | Tanzawa et al. | |

(Continued)

FOREIGN PATENT DOCUMENTS

EP    1063652 A2    12/2000
WO    9844511 A1    10/1998

OTHER PUBLICATIONS

Non-Final Office Action for U.S. Appl. No. 10/445,358 mailed Jun. 6, 2006, 7 pages.

(Continued)

*Primary Examiner* — Tuan Thai

(74) *Attorney, Agent, or Firm* — Toler Law Group, PC

(57) ABSTRACT

A memory device includes an executable flash memory partition and a non-executable partition, both partitions being fabricated on a common die. Preferably, both partitions are fabricated using the same flash memory technology. Most preferably, the flash cells of both partitions have insulating floating gates.

20 Claims, 2 Drawing Sheets

(56) References Cited

U.S. PATENT DOCUMENTS

| | | | |
|---|---|---|---|
| 6,816,421 B2 | 11/2004 | Tanzawa et al. | |
| 6,823,435 B1 | 11/2004 | Wisor | |
| 7,047,426 B1 | 5/2006 | Andrews et al. | |
| 2001/0036109 A1 | 11/2001 | Jha et al. | |
| 2002/0089883 A1 | 7/2002 | Pepi et al. | |
| 2002/0120820 A1 | 8/2002 | Higuchi et al. | |
| 2002/0138702 A1* | 9/2002 | Gefen et al. | 711/154 |
| 2002/0184435 A1* | 12/2002 | Lambino et al. | 711/103 |
| 2002/0188812 A1 | 12/2002 | Sadhasivan et al. | |
| 2004/0010681 A1* | 1/2004 | Lee | 713/2 |
| 2004/0206981 A1 | 10/2004 | Gross et al. | |
| 2005/0038983 A1 | 2/2005 | Moran | |

OTHER PUBLICATIONS

Non-Final Office Action for U.S. Appl. No. 10/445,358 mailed Dec. 26, 2006, 10 pages.
Final Office Action for U.S. Appl. No. 10/445,358 mailed Apr. 24, 2007, 11 pages.
Advisory Action for U.S. Appl. No. 10/445,358 mailed Jun. 29, 2007, 3 pages.
Non-Final Office Action for U.S. Appl. No. 10/445,358 mailed Oct. 12, 2007, 12 pages.
Final Office Action for U.S. Appl. No. 10/445,358 mailed Mar. 17, 2008, 18 pages.
Advisory Action for U.S. Appl. No. 10/445,358 mailed Jun. 27, 2008, 4 pages.
Non-Final Office Action for U.S. Appl. No. 10/445,358 mailed Oct. 6, 2008, 15 pages.
Final Office Action for U.S. Appl. No. 10/445,358 mailed Apr. 17, 2009, 14 pages.
Non-Final Office Action for U.S. Appl. No. 10/445,358 mailed Oct. 1, 2009 14 pages.
Final Office Action for U.S. Appl. No. 10/445,358 mailed Mar. 15, 2010, 14 pages.
Notice of Allowance and Fee(s) Due for U.S. Appl. No. 10/445,358 mailed Apr. 14, 2011, 8 pages.
Notice of Allowance and Fee(s) Due for U.S. Appl. No. 10/445,358 mailed Jul. 20, 2011, 5 pages.
Notice of Allowance and Fee(s) Due for U.S. Appl. No. 10/445,358 mailed Oct. 26, 2011, 5 pages.
"Toshiba Develops 8Mb Low-Power SRAM Device and 8Mb SRAM/64Mb NOR Flash Stacked MCP Memory Device," Press Release, Wave Issue 2014 Mar. 13, 2000 Article 4-05, http://www.wave-report.com/archives/2000/20140405.htm, Mar. 13, 2000, 2 pages.
"Toshiba Develops 32Mb Read While Write NOR Flash Memory Device," Press Release, http://www.toshiba.com/taec/news/press_releases/2000/to-077_isp, Apr. 3, 2000, 1 page.
"Fujitsu Introduces World's First 64Mb NOR-type Flash Memory with 'Mirror Flash' Multi-Bit Cell Architecture," Press Release, http://www.fujitsu.com/us/news/pr/fma_20020514.html, May 14, 2002, 3 pages.
"New MirrorFlash™ Flash Memory from Fujitsu Named Jul. 2002 'Product of the Month' by Electronic Products Magazine," Press Release, http://www.embeddedstar.com/press/content/2002/8/embedded4956.html, Aug. 28, 2002, 4 pages.
Geek.com Geek News, "Mirrorbit is here from AMD," http://www.geek.com/news/geeknews/2002may/bch20020514011688.htm, May 14, 2002, 3 pages.
"AMD Intros First Mirror Bit Flash Device," Press Release, http://www.pcstats.com/releaseview.cfm?releaseID=873, May 13, 2002, 5 pages.
"Implementing a Common Layout for AMD MirrorBit™ and Intel StrataFlash™ Memory Devices," Advanced Micro Devices, Inc., 2002, pp. 1-13.
Intel Corporation, "EEPROM Replacement with Flash Memory," AP-685 Application Note, Dec. 1998, pp. 1-20.
Maayan, Eduardo et al. "A 512Mb NROM Data Storage Memory with 8MB/s Data Rate," Presented at the International Solid-State Circuits Conference, San Francisco, CA, Feb. 2002, Saifun Semiconductors Ltd, pp. 1-8.
"64M-bit (x8/x16) MirrorFlash™ Memory, MBM29LP640UHM/MBM29LP640ULM," FIND, vol. 20, No. 3, 2002, pp. 22-25.

* cited by examiner

MONOLITHIC READ-WHILE-WRITE FLASH MEMORY DEVICE

This is a Continuation of U.S. patent application Ser. No. 10/445,358 filed May 27, 2003, which is a continuation-in-part of U.S. Provisional Patent Application No. 60/463,556 filed Apr. 16, 2003.

FIELD AND BACKGROUND OF THE INVENTION

The present invention relates to flash memory devices and, more particularly, to a flash memory device that combines executable and non-executable memory on a common semiconductor die.

Flash memory is a well-known data storage technology that is widely used for non-volatile data storage. Generally speaking, there are two classes of flash memory devices: random access devices and serial access devices.

Random-access flash devices are devices that can be randomly accessed for reading. Any storage bit within such a device can be directly accessed for reading by providing the address of the bit on the device pins and then immediately getting the requested bit value (without the device having to first internally access non-requested cells or to go through a sequence of command codes). There are two main types of random-access flash devices. One type of random-access flash device uses flash cells with conductive floating gates. Examples of this type of flash device include NOR devices, such as those manufactured and sold by Intel, AMD and other companies. The other type of random-access flash device uses flash cells with insulating floating gates. Examples of this type of flash device include the MirrorBit devices manufactured and sold by AMD (also offered by Fujitsu under the name MirrorFlash) and the NROM devices manufactured and sold by Saifun Semiconductors of Netanya, Israel.

Serial-access flash devices are devices in which the above is not valid. Storage bits within such a device can not be directly accessed for reading. When the value of a bit has to be read, the device receives an address identifying a relatively large chunk of bits (typically a sector of 512 bytes=4096 bits), all the bits in the chunk are accessed and loaded into an internal RAM buffer within the device, and only then it is possible to get the value of the requested bit by providing its location within the chunk of data in the buffer. Example of such serial-access flash devices include NAND devices, such as those manufactured and sold by Toshiba, Samsung and other companies.

One advantage of serial access flash devices over random access flash devices is that serial access devices are more compact than comparable random access devices. This is because, with no need to access each bit individually, both the cells and the associated decoding and driving circuitry of a serial access device are smaller than the cells and the decoding and driving circuitry of a comparable random access device. A serial access device thus packs more bits into the same semiconductor area than a comparable random access device and costs less per bit than a comparable random access device.

The above description treats the flash devices as storing independent bits. Most flash devices are actually organized in 8-bit bytes or 16-bits words (i.e. even in a random-access device it is not possible to read just a single bit and the minimum group of bits that can be accessed is a byte or a word). However, this detail has no significance for the present disclosure and therefore the single bit picture may be used for illustrational simplicity.

Flash cells can may be either binary (i.e. one bit per cell) or multi-level (i.e. more than one bit per cell) as in Harari, U.S. Pat. No. 5,043,940 and in Assar et al., U.S. Pat. No. 5,596,526. The present disclosure is applicable to both kinds of flash cells, even though for illustrational simplicity the explanations may be in terms of binary cells.

Another way to classify flash memory devices is according to whether or not they are executable. An "executable" flash device is a flash device in which computer machine code can be stored and directly executed in place without first being copied to some other memory device. The two classifications, random-access vs. serial-access and executable vs. non-executable, are not independent, as can be seen from the following three considerations:

1. Both random-access flash memory devices and serial-access flash memory devices can be used for data storage.

2. Computer code is just a particular type of data, that can be stored either in a random-access flash memory device or in a serial-access flash memory device.

3. Only random-access memory devices are executable. This is because while executing the code, the executing processor needs to access random locations within the memory. For example, a JUMP command in the code makes the processor ask for a next location that can be far away from the previous location.

Modern cellular telephones, personal data assistants (PDAs) and similar electronic devices need to store both code and non-code data. There are at least four ways to do this using flash memory devices:

1. Use a first flash memory device, which may be executable or non-executable, for non-code data storage. Use a second, executable flash memory device for code storage. Execute the code in-place from the second device.

2. Use a first flash memory device, which may be executable or non-executable, for non-code data storage. Use a second flash memory device, which also may be executable or non-executable, for code storage. The code to be executed is copied from the second flash memory device to a volatile random access memory (RAM) and is executed from the RAM. This design requires at least a small amount of executable non-volatile memory for executing the system's boot code on start-up. This boot code memory can be either in the second flash memory device (if the second flash memory device is executable) or in a separate integrated circuit.

3. Use a single, executable flash memory device to store both code and non-code data. The code is executed in-place from the flash memory device.

4. Use only one flash memory device, which may be executable or non-executable, to store both code and non-code data. The code to be executed is copied from the flash memory device to RAM and is executed from the RAM. As in the second option, there must be at least a small amount of executable non-volatile memory for executing boot code.

Each of these four architectures has its own respective advantages and disadvantages. All four architectures are in use today. However, as reducing manufacturing costs becomes more and more important, there is a clear advantage to the third architecture above that uses a single flash integrated circuit rather than two integrated circuits and that does not require adding extra RAM from which to execute the code. Therefore, recently, more and more cellular phones and PDAs are being made with only one flash memory device, from which flash memory device the code is executed directly in-place.

Nevertheless, there is an inherent problem in the configuration that executes code on the same flash memory device in which non-code data are stored. When non-code data are written or erased, the flash memory device requires a relatively long time to complete the write or erase operation. For example, in a typical NOR flash device, reading takes tens of nanoseconds per randomly read data unit (byte or word, depending on the specific device architecture), writing takes a few microseconds per randomly written data unit (byte or word) and erasing, which is done in units of entire blocks (typically 64 Kilobytes per block), takes hundreds of milliseconds. While a flash memory device is occupied with writing or erasing, it may not be able to respond to read requests for code to be executed. The execution of code that invokes a write or erase operation could actually block the continued execution of other code, resulting in a cellular telephone or PDA with this kind of memory configuration hanging.

Two methods are employed in the prior art to overcome this problem.

The first method is to split the executable flash memory device into two or more separate portions, often referred to as "partitions", that are capable of independent operation. In this context, "independence" means that even though a write/erase operation is taking place in one partition, a read request from another partition can still be served immediately without waiting for write/erase completion and without interfering with the write/erase operation. This capability is called "Read While Write" or "RWW" by some flash vendors. A flash memory device that supports such capability stores and executes the code in one partition and stores the non-code data in another partition. Both Intel and AMD offer such devices. It should be noted that each partition is capable of supporting either code or non-code data, and it is up to the system designer to decide where to keep the code and where to keep the non-code data (of course making sure the processor is directed to a code section upon system boot).

The second method is to use software to "shield" the flash memory device from the problem by guaranteeing that in-place code execution never overlaps flash write or flash erase in time. Such solutions are not trivial and require some clever programming. Simply put, the flash supporting software copies some of its flash access code into RAM, and then when a write/erase operation is initiated, the flash supporting software makes sure the only code that runs during the operation time is code executed from RAM. Because the system might receive high priority external interrupts that require immediate handling and cannot wait for the completion of the flash operation (e.g. getting an incoming call in a cellular telephone), the flash supporting software must disable interrupts before starting the write/erase operation (to keep the processor from jumping to the interrupt service routine) and must continuously monitor for incoming interrupts. If such an interrupt is detected, the flash support software suspends the write/erase operation, allows the interrupt to be serviced, and then resumes the operation. Compared to the first method, this method is not easy to configure and port to new flash memory devices; but this is the only option for a flash memory device that lacks RWW capability. Intel offers two software packages, called FDI and PSM, for supporting its flash memory devices, that work according to these principles.

There remains a major deficiency in the flash devices used in systems that have the third architecture described above (one flash memory device for both code and non-code data, with code executed in place). Even though only a portion of the flash memory device is used for code execution and so needs to be executable, all portions of the flash memory device are fully executable. This is a disadvantage because executable flash memory occupies more area on a semiconductor die than equivalent non-executable flash memory. This extra cost of "executability" is paid even for portions of the flash memory that do not require it. Some semiconductor manufacturers (e.g., Samsung) recognize this deficiency and offer flash packages that are assemblies of multiple flash dies, some of which are executable and some of which are not executable. However, such "Multi-Chip Packages" offer a less than satisfactory solution to this problem, for several reasons. These packages usually are larger in height than conventional integrated circuits; their assembly costs are higher than the assembly costs of conventional integrated circuits; and they are generally less convenient to work with than conventional flash memory integrated circuits because they include flash dies of disparate technologies that require different interfacing and access methods.

There is thus a widely recognized need for, and it would be highly advantageous to have, a RWW flash memory device that would overcome the disadvantages of presently known RWW flash memory devices as described above.

SUMMARY OF THE INVENTION

According to the present invention there is provided a memory device including: (a) an executable flash memory partition; and (b) a non-executable partition; both of the partitions being fabricated on a common die.

Preferably, the non-executable partition is a serial-access partition. Alternatively, the non-executable partition is a random-access partition.

Preferably, both the executable partition and the non-executable partition are flash memory partitions. More preferably, both partitions are fabricated using a common flash memory technology. Most preferably, this common flash memory technology uses flash cells with insulating floating gates.

The scope of the present invention also includes an electronic device that includes a flash memory device of the present invention. Preferred examples of such electronic devices include cellular telephones and personal data assistants.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a monolithic (i.e., fabricated on a single semiconductor die) RWW flash memory device that is more compact than comparable prior art devices. The present invention can be used to store both in-place executable code and other data, with no interference between the execution of the code and slow (write or erase) operations on the other data.

The principles and operation of a monolithic RWW flash memory device according to the present invention may be better understood with reference to the drawings and the accompanying description.

Figure 1:
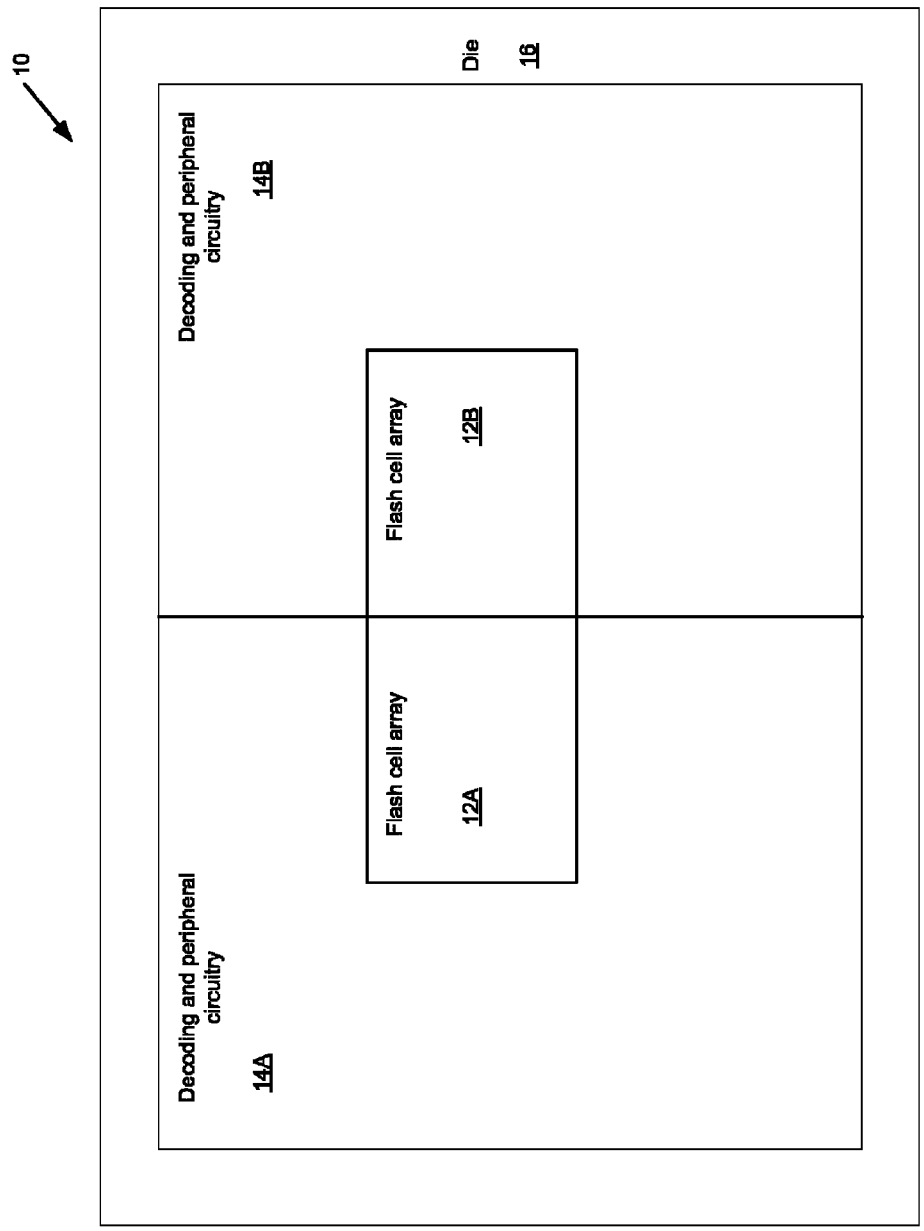
FIG. 1 is a schematic diagram of the layout of a prior art RWW flash memory device.

Referring now to the drawings, FIG. 1 is a schematic diagram of the layout of a prior art RWW flash memory device 10. Device 10 includes a random-access flash cell array 12 that is partitioned into two partitions 12A and 12B. Each partition 12A and 12B has its own respective decoding and peripheral circuitry 14 that employs random access techniques and architectures to enable reading and writing selected bytes or words in that partition 12A and 12B. Partitions 12 and the associated circuitry 14 are fabricated on a common semiconductor (typically silicon) die 16.

As described above, a system designer selects one of partitions 12A or 12B for storing code and executing the stored code in-place, and uses the other partition for storing non-code data. Write and erase operations are executed on the partition 12A or 12B that is used to store the non-code data, simultaneously with the in-place execution of the code stored in the other partition 12A or 12B.

Figure 2:
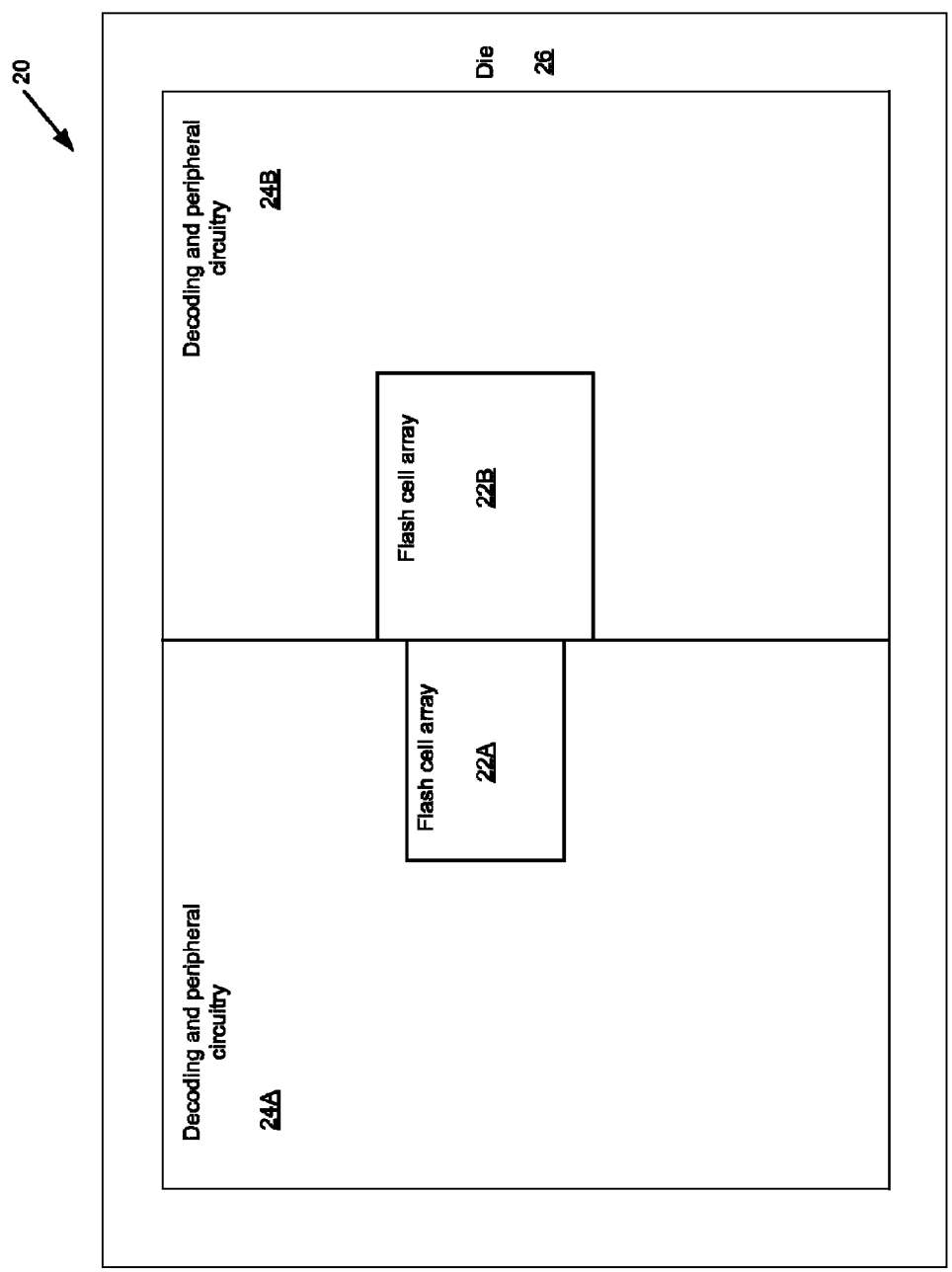
FIG. 2 is a schematic diagram of the layout of a flash memory device of the present invention.

FIG. 2 is a schematic diagram of the layout of a flash memory device 20 of the present invention. Device 20 includes a flash cell array 22 that is partitioned into partitions 22A and 22B. Each partition 22A and 22B has its own respective decoding and peripheral circuitry 24. Circuitry 24A employs random access techniques and architectures to enable reading and writing selected bytes or words in partition 22A, thus making partition 22A executable. Circuitry 24B employs serial access techniques and architectures to enable reading and writing selected sectors in partition 22B, thereby avoiding the extra overhead that would be required to make partition 22B executable. Partitions 22 and the associated circuitry 24 are fabricated on a common semiconductor die 26. Because circuitry 24B is simpler than circuitry 24A, circuitry 24B occupies less area per associated flash cell on die 26 than circuitry 24A. This is illustrated symbolically in FIG. 2 by giving circuitry 24B a smaller area than circuitry 24A, and by giving partition 22B a correspondingly larger area than partition 22A.

Partition 22A, being executable, is used to store code and to execute the stored code in-place. Partition 22B, being non-executable, is used to store non-code data. Write and erase operations are executed on partition 22B simultaneously with the in-place execution of the code in partition 22A. Note that code that is stored in partition 22B and copied to another location (for example RAM) for execution is considered to be non-code data in the present context.

Preferably, both partitions 22 are fabricated using the same flash memory technology. Most preferably, the flash cells of partitions 22 are fabricated with insulating floating gates. The use of insulating floating gate technology allows the flash cells of partition 22A to be fabricated as random-access flash cells and the flash cells of partition 22B to be fabricated as serial-access flash cells. The present invention is based on the realization that insulating floating gate technology could be used to fabricate both a random-access flash cell array and a serial-access flash cell array on the same die 26, while achieving relatively good performance for both non-code data handling and in-place code execution. The relatively good write/erase performance required for non-code data handling is available because insulating gate technology is a type of NOR technology that can achieve a write/erase speed similar to NAND technology.

Alternatively, the flash cells of both partitions 22 are fabricated as random-access flash cells using an inherently random-access flash technology such as conventional NOR flash. Under that alternative, what makes partition 22B non-executable is the associated circuitry 24B that allows only serial access to partition 22B. This alternative is less preferred than the use of insulating gate technology because of this alternative's relatively poorer performance in non-code data handling in partition 22B.

A third, much less preferred option is to fabricate partitions 22A and 22B using different flash technologies, for example (random-access) NOR flash for executable partition 22A and (serial-access) NAND flash for non-executable partition 22B. This option is much less preferred because the differences in the manufacturing methods of the two flash technologies make using both flash technologies on the same die 26 difficult and not cost-effective.

It should be noted that, although the scope of the present invention includes non-executable partitions 22B that are based on a data storage technology other than flash memory, the present invention requires executable partition 22A to be based on flash memory technology. Thus, the scope of the present invention explicitly excludes devices with executable RAM, prior art examples of which devices include, for example, the MDOC devices available from M-Systems of Kfar Saba, Israel.

While the invention has been described with respect to a limited number of embodiments, it will be appreciated that many variations, modifications and other applications of the invention may be made.

What is claimed is:

1. A memory device comprising:
   an executable flash memory partition;
   a non-executable flash memory partition;
   circuitry configured to perform at least one of a write operation and an erase operation in the non-executable flash memory partition concurrently with a processor executing code in the executable flash memory partition; and
   wherein the executable flash memory partition, the non-executable flash memory partition, and the circuitry are fabricated on a common die.

2. The memory device of claim 1, wherein the non-executable flash memory partition is a serial-access flash memory partition.

3. The memory device of claim 1, wherein the non-executable flash memory partition is fabricated as including serial-access flash cells, and the executable flash memory partition is fabricated as including random-access flash cells.

4. The memory device of claim 1, wherein the circuitry comprises first circuitry for managing the executable flash memory partition and second circuitry for managing the non-executable flash memory partition.

5. The memory device of claim 4, wherein the second circuitry occupies a smaller area per cell on the common die than the first circuitry occupies per cell on the common die.

6. The memory device of claim 1, wherein both of the flash memory partitions are fabricated using a common flash memory technology.

7. The memory device of claim 1, wherein each flash memory cell of the executable flash memory partition has a first memory structure, and wherein each flash memory cell of the non-executable flash memory partition has a second memory structure that differs from the first memory structure.

8. An electronic device comprising the memory device of claim 1.

9. The electronic device of claim 8, wherein the electronic device is one of a cellular telephone or a personal data assistant.

10. A method of operating an electronic device, the method comprising:
   in a memory device that includes
      an executable flash memory partition,
      a non-executable flash memory partition, and circuitry configured to perform at least one of a write operation and an erase operation in the non-executable flash memory partition concurrently with a processor executing code in the executable flash memory partition, wherein the executable flash memory partition, the non-executable flash memory partition, and the circuitry are fabricated on a common die, performing:

storing, in the executable flash memory partition, the executable code for operating the electronic device; and executing the executable code in-place to operate the electronic device, wherein the executable code that is executed in-place in the memory device to operate the electronic device is stored only in the executable flash memory partition in the memory device.

11. The method of claim 10, wherein the circuitry comprises first circuitry for managing the executable flash memory partition and second circuitry for managing the non-executable flash memory partition, and wherein the second circuitry occupies a smaller area per cell on the common die than the first circuitry.

12. An electronic device comprising a memory device coupled to a processor, the memory device comprising:

an executable flash memory partition having stored therein code usable for operating the electronic device;

a non-executable flash memory partition; and circuitry configured to perform at least one of a write operation and an erase operation in the non-executable flash memory partition concurrently with the processor executing the code in the executable flash memory partition, wherein the executable flash memory partition, the non-executable flash memory partition, and the circuitry are fabricated on a common die, and wherein the code being executed is stored only in the executable flash memory partition.

13. The electronic device of claim 12, wherein the non-executable flash memory partition is a serial-access flash memory partition.

14. The electronic device of claim 12, wherein the non-executable flash memory partition is fabricated as including serial-access flash cells, and wherein the executable flash memory partition is fabricated as including random-access flash cells.

15. The electronic device of claim 12, wherein the circuitry comprises first circuitry for managing the executable flash memory partition and second circuitry for managing the non-executable flash memory partition.

16. The electronic device of claim 15, wherein the second circuitry occupies a smaller area per cell on the common die than the first circuitry.

17. The electronic device of claim 12, wherein the executable flash memory partition and the non-executable flash memory partition are fabricated using a common flash memory technology.

18. The electronic device of claim 12, wherein each flash memory cell of the executable flash memory partition has a first memory structure, and wherein each flash memory cell of the non-executable flash memory partition has a second memory structure that differs from the first memory structure.

19. The electronic device of claim 18, wherein the executable flash memory partition includes a NOR flash memory structure, and wherein the non-executable flash memory partition includes a NAND flash memory structure.

20. The electronic device of claim 19, wherein the electronic device is one of a cellular telephone and a personal data assistant.

* * * * *